United States Patent
Reitz et al.

(10) Patent No.: US 11,169,193 B2
(45) Date of Patent: Nov. 9, 2021

(54) METHOD AND DEVICES FOR DETERMINING THE ELEMENTS OF A DIELECTRIC EQUIVALENT CIRCUIT DIAGRAM FOR AN INSULATION OF AN ELECTRIC SYSTEM

(71) Applicant: Bender GmbH & Co. KG, Gruenberg (DE)

(72) Inventors: Julian Reitz, Gruenberg (DE); Eckhard Broeckmann, Giessen (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 16/776,645

(22) Filed: Jan. 30, 2020

(65) Prior Publication Data

US 2020/0256905 A1     Aug. 13, 2020

(30) Foreign Application Priority Data

Feb. 12, 2019 (DE) .................... 10 2019 103 396.9

(51) Int. Cl.
*G01R 27/18*     (2006.01)
*G01R 31/52*     (2020.01)
(Continued)

(52) U.S. Cl.
CPC ......... *G01R 27/18* (2013.01); *G01R 27/2605* (2013.01); *G01R 31/14* (2013.01); *G01R 31/40* (2013.01); *G01R 31/52* (2020.01)

(58) Field of Classification Search
CPC .... G01R 27/18; G01R 31/52; G01R 27/2605; G01R 31/14; G01R 31/40; G01R 27/025; G01R 31/1227; G01R 1/28
(Continued)

(56) References Cited

U.S. PATENT DOCUMENTS

2012/0126839 A1*   5/2012   Schaefer ................ G01R 27/18
324/750.01

FOREIGN PATENT DOCUMENTS

DE     102014016245 A1     6/2015

OTHER PUBLICATIONS

Jean-Jacques Alff, et al.; "A Novel, Compact Instrument for the Measurement and Evaluation of Relaxation Currents Conceived for On-Site Diagnosis of Electric Power Apparatus"; Switzerland; 2000.

(Continued)

*Primary Examiner* — Farhana A Hoque
(74) *Attorney, Agent, or Firm* — Dickinson Wright PLLC; Andrew D. Dorisio (57) ABSTRACT

A method and a test apparatus for determining the elements of a dielectric equivalent circuit diagram for an insulation of an electric system and to an insulation monitoring device. All data points of the system's step response are stored for a measuring period $T_m$, and fault resistance $R_f$ and an initial value $C_{e0}$ of leakage capacitance $C_e$ are calculated. After this determination of fault resistance $R_f$ and initial value $C_{e0}$, the elements of absorption element $R_a$ and $C_a$ and leakage capacitance $C_e$ are determined by numeric signal processing by using an approximation algorithm which continuously simulates the recorded step response. For simulating the step response, a transfer function G(s) modelled by the equivalent circuit diagram having equivalent circuit diagram elements $R_f$, $C_e$, $R_a$, $C_a$ and measurement resistance $R_m$ is formed analytically and the output signal is calculated, which is described using transfer function G(s), by means of the step function.

7 Claims, 5 Drawing Sheets

(51) Int. Cl.
    *G01R 27/26*     (2006.01)
    *G01R 31/14*     (2006.01)
    *G01R 31/40*     (2020.01)

(58) Field of Classification Search
    USPC .................................................. 324/750.01
    See application file for complete search history.

(56) References Cited

OTHER PUBLICATIONS

Kuchler, et al.; "Condition Assessment of Aged Transformer Bushing Insulations"; www.cigre.org; Paris; 2006.

Saha, et al.; "Deriving an Equivalent Circuit of Transformers Insulation for Understanding the Dielectric Response Measurements"; IEEE Transactions on Power Supply Delivery, vol. 20, No. 1; 2005.

PDC-Analyser-1Mod; "Determination of the moisture content in the pressboard and the oil conductivity in power transformers"; Alff Engineering; Switzerland; www.alff-engineering.ch; 2016.

"Return Voltage Measurements—a Good Tool for the Diagnosis of Paper-Oil Insulations"; Patsch, et al.; Institute of Materials & Diagnostics in Electrical Engineering; University of Siegen; Germany; 2005.

https://en.wikipedia.org/wiki/Numerical_analysis—Accessed on May 25, 2021.

https://artofproblemsolving.com/wiki/index.php/Approximation_Techniques—Accessed on May 25, 2021.

https://www.springer.com/gp/book/9789491216497—Accessed on May 25, 2021.

https://en.wikipedia.org/wiki/Least_squares.

\* cited by examiner

METHOD AND DEVICES FOR DETERMINING THE ELEMENTS OF A DIELECTRIC EQUIVALENT CIRCUIT DIAGRAM FOR AN INSULATION OF AN ELECTRIC SYSTEM

This application claims the benefit of German Patent Application No. DE 10 2019 103 396.9, filed Feb. 12, 2019, the disclosure of which is incorporated herein by reference.

TECHNICAL FIELD

The invention relates to a method and devices for determining the elements of a dielectric equivalent circuit diagram for an insulation of an electric system, the equivalent circuit diagram being a parallel connection made up of a fault resistance, a leakage capacitance and an absorption element which is made up of a series connection of an absorption resistance and an absorption capacitance.

BACKGROUND

Power supply systems have electrically conductive elements which have to be separated from one another under certain circumstance via insulation material. In particular when installing ungrounded power supply systems an insulation resistance must be monitored. The complex-valued insulation resistance (insulation impedance) is modelled by an equivalent circuit diagram of the power-supplying electric conductor which consists of a parallel connection of a leakage capacitance and an ohmic fault resistance (real part of the insulation impedance). For monitoring the fault resistance, insulation monitoring devices are more preferably used. Measuring the insulation resistance is particularly challenging in electric installations having a very large insulation level larger than 500 MΩ.

This includes submarine cables or high voltage batteries (HV batteries).

Prevailing insulation monitoring devices which have been optimized for the high-impedance measuring range but are based on existing analysis technology have shortcomings regarding measurement precision. An equivalent circuit diagram which is insufficient for the high-impedance applications and does not take the dielectric absorption of the insulation material into account is cited as the source of error.

IEEE standard 43-2000 shows an equivalent circuit diagram for insulations to which an additional parallel-switched RC row element and an absorption element consisting of an absorption resistance $R_a$ and an absorption capacitance $C_a$ has been added in addition to the aforementioned parallel connection of the leakage capacitance, the absorption element quantifying the dielectric absorption behavior.

The dielectric characteristics of an insulation change over time with age and environment and serve as an indicator to the premature identification of a gradually deteriorating insulation. A routine quantification of the dielectric could be used in addition to the hitherto known exclusive measurement of the ohmic fault resistance in order to be able to detect signs of aging insulations much sooner and to be able to assess their electric state. Owing to this, maintenance on the electric system could be planned much sooner.

No technical solution exists for directly quantifying the equivalent circuit diagram with dielectric observation of an insulation in an electric system, in particular in an active ungrounded power supply system.

In ungrounded power supply systems, the dielectric characteristics of the insulation material are presently disregarded, only the effects of a deteriorating insulation due to continuously measuring the fault resistance is being monitored. In grounded networks, the cyclic measurement of a polarization index is most notably performed, although disadvantageously the network has to be switched off. The polarization index is an artificial size and offers information on the dielectric characteristics of an insulation without, however, quantifying it.

Furthermore, the method of impedance spectroscopy is known which, however, is constricted in particular to tests in laboratories in the field of materials sciences and operates in the frequency domain. Moreover, this method is not suitable for an immensely high-impedance range and for use in an active electric system.

SUMMARY

The object of the invention at hand is therefore to propose a method and an arrangement for determining the elements of a dielectric equivalent circuit diagram for an insulation of an electric system, the electric system being considered in particular an ungrounded power supply system during operation.

The object is attained by the features of claim 1.

After applying a voltage step to the electric system as test current $u_0(t)$ of a voltage source, which has a measurement resistance $R_m$ connected in series to the voltage source, step response $u_a(t)$ is measured and recorded over a measuring period $T_m$ whose duration is approximately the twofold duration of the settling phase of step response $u_a(t)$. Unlike methods known from the state of the art in which the measurement is interrupted with regard to quickly identifying the insulation resistance as soon as a stable state is attained, the measurement and recording takes place over a longer measuring period $T_m$.

All data points of step response $u_a(t)$ are stored over the duration of measuring period $T_m$ and are subjected subsequently to digital signal processing. First, fault resistance $R_f$ is analytically identified from the progression of entirely settled step response $u_a(t)$ between one half of measuring period $T_m$ and the end of measuring period $T_m$ preferably by determining an average.

Time constant $\tau$ is determined from the progression of step response $u_a(t)$ in the settling phase, the end of the settling phase corresponding to approximately five times time constant $\tau$. An initial value $C_{e0}$ of leakage capacitance $C_e$ is calculated from time constant $\tau$, fault resistance $R_f$ and measurement resistance $R_m$.

After this analytical determination of fault resistance $R_f$ and initial value $C_{e0}$ of leakage capacitance $C_e$, the elements of absorption element $R_a$ and $C_a$ and leakage capacitance $C_e$ are determined by means of numerical signal processing.

An approximation algorithm is used for this which continuously simulates the actual measuring signal, i.e., recorded step response $u_a(t)$, with the aid of known measurement resistance $R_m$ and the already analytically identified equivalent circuit diagram elements fault resistance $R_f$ and initial value $C_{e0}$ of leakage capacitance $C_e$. Initial values for absorption resistance $R_a$ and absorption capacitance $C_a$ form approximated values $R'_a$, $C'_a$ and $C'_e$ gathered from value fields.

For simulating step response $u_a(t)$, a transfer function $G(s)$ of the electric system modelled by the equivalent circuit diagram, which has equivalent circuit diagram elements $R_f$, $C_e$, $R_a$, $C_a$ and measurement resistance $R_m$, is analytically formed which expresses the ratio between an output signal $U'_a(s)$ at measurement resistance $R_m$ and a test signal $U_0(s)$ of the voltage source as an input signal:

$$G(s)) = U'_a(s))/U_0(s)$$

$$G(s)) = \frac{\begin{array}{c}(R_m \cdot R_f \cdot R_a \cdot C_e \cdot C_2)s^2 + \\ (R_m(R_a \cdot C_a + C_e \cdot R_f + R_f \cdot C_a))s + R_m\end{array}}{\begin{array}{c}(R_m \cdot R_f \cdot R_a \cdot C_e \cdot C_a)s^2 + \\ (R_m(R_a \cdot C_a + C_e \cdot R_f + R_f \cdot C_a) + R_f \cdot R_a \cdot C_a)s + (R_m + R_f)\end{array}}$$

The dependence on variable s describes the Laplace transform (written in capitals) of the corresponding time range quantities (written in minuscule). Primed quantities represent iteratively changeable quantities in the sense of the approximation solution.

Output signal $U'_a(s)=U_0(s)*G(s)$ is calculated by means of transfer function $G(s)$ and is yielded when activating the electric system, which is described via transfer function $G(s)$, by means of the step function as test signal $U_0(s)$. The calculation is carried out while incorporating calculated fault resistance $R_f$, calculated initial value $C_{e0}$ of leakage capacitance $C_e$ and known measurement resistance $R_m$, while leakage resistance $R_a$, leakage capacitance $C_a$ and leakage capacitance $C_e$ are each iteratively determined in such a manner via approximated values $R'_a, C'_a, C'_e$ by means of the approximation algorithm that the deviation between calculated output signal $U'_a(s)$ transformed in the time range $(u'_a(t))$ and measured recorded step response $u_a(t)$ is minimized.

If the deviation falls below a certain threshold value, the approximation process can be aborted and elements $R_a, C_a, C_e$ of the equivalent circuit diagram can be deemed as being determined precisely enough via approximated values $R'_a, C'_a, C'_e$.

The approximation algorithm beneficially minimizes the deviation in a temporal section between four- and fivefold time constant τ and the metrological end of the settling phase at approximately ⅗ of measuring period $T_m$.

The approximation algorithm is focused on the signal section between the point in time in which approximately four to five times time constant τ is attained and the metrological end of the settling process, although an overlap of sections is definitely possible.

In order to receive a faster approximation to the step response recorded via the data points, the approximation algorithm is limited to minimizing the deviation to the middle section of the signal progression and masks the beginning and the end section of step response $u_a(t)$. As a function of this application necessity, this middle section can be reduced or lengthened in order to "focus" the approximation section through reduction, for example.

In another embodiment, the approximation algorithm functions according to the least squares method.

The least squares method (LS method) known from the state of the art is used as the approximation method. For this purpose, the quantities absorption resistance $R_a$, absorption capacitance $C_a$ and leakage capacitance $C_e$ of transfer function $G(s)$ are determined numerically in such a manner that the sum of the square deviation of the step response calculated using the approximated values of this parameter, i.e., output signal $U'_a(t)$ transformed in the time range $(u'_a(t))$, is minimized by the recorded data points of step response $u_a(t)$.

Preferably, the method for determining the dielectric characteristics of an insulation in ungrounded power supply systems is applied numerically in conjunction with insulation monitoring.

Since monitoring the insulation resistance in ungrounded power supply networks is a standardized prerequisite and the use of insulation monitoring devices is prescribed according to product standard IEC61557-8, the method according to the invention can be used particularly beneficially for improving the measurement precision when determining the insulation resistance in ungrounded power supply networks.

The method according to the invention may first and foremost be designed for use in ungrounded power supply networks, however, it is not limited to this usage. The method can therefore transcend the application in ungrounded power supply systems and can be used in electric systems in general, although an existing protective ground conductor, e.g., in a grounded network, may have to be disconnected. The method can be used particularly effectively in electric systems whose insulation resistance is larger than 100 MΩ, since the polarization currents are small enough to be neglected in smaller impedances.

In implementing the method according to the invention, the object of the invention is further attained by a test device for determining the elements of a dielectric equivalent circuit diagram for an insulation of an electric system comprising a signal processing device which is configured for executing the method according to claims 1 to 4 of the invention. In this respect, the advantages garnered by the method according to the invention also pertain to a test device according to the invention in the same manner, the test device being configured for executing the method according to the invention.

Besides realizing the method according to the invention in an autonomous test device, the method can be beneficially be implemented in an insulation monitoring device for identifying an insulation resistance of an ungrounded power supply system, this insulation monitoring device comprising a signal processing device which is configured for executing the method according to claims 1 to 4 of the invention.

For improving the measuring precision when determining the insulation resistance, in particular in ungrounded power supply systems having a considerable insulation level larger than 500 MΩ, an existing insulation monitoring device which is a standardized prerequisite can be enhanced with a signal processing device which executes the method according to the invention.

Preferably, the insulation monitoring device comprises a variable measurement resistance $R_m$ and/or a variable coupling impedance for low-noise identification for a test voltage $u_0(t)$ having variable amplitude.

A variable measurement resistance and/or a variable coupling impedance of the insulation monitoring device enables particularly low-noise identification in particular for test voltages having variable amplitudes.

BRIEF DESCRIPTION OF THE DRAWING FIGURES

Further advantageous embodiment features can be derived from the following description and the drawings which show a preferred embodiment of the invention by means of examples.

DETAILED DESCRIPTION

Figure 1:
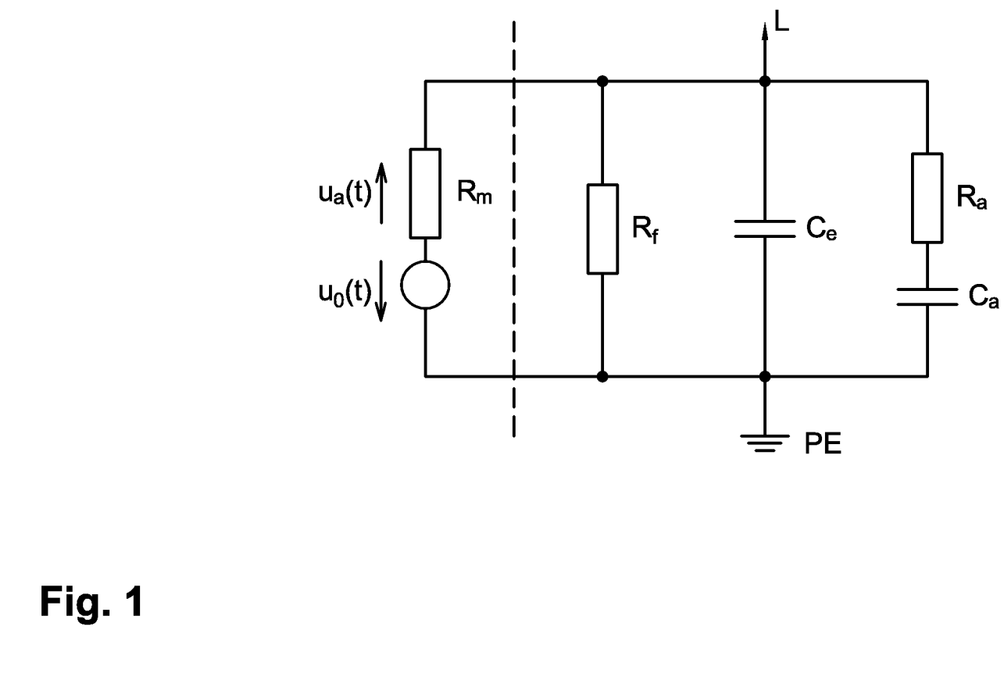
FIG. 1 shows a dielectric equivalent circuit diagram for an insulation.

In FIG. 1 a dielectric equivalent circuit diagram is shown for an insulation in a test circuit. Between a conductor L, e.g., of an ungrounded power supply system, and ground PE, fault resistance $R_f$ and leakage capacitance $C_e$ are effective which together form the complex-valued insulation resistance (insulation impedance) of the ungrounded power supply system. In order to describe the dielectric absorption behavior of the insulation between conductor L and ground PE, the equivalent circuit diagram is enhanced with an absorption element which is switched parallel to the insulation impedance and consists of the series connection of an absorption resistance $R_a$ and an absorption capacitance $C_a$.

For determining the equivalent circuit diagram quantities $R_f$, $C_e$, $R_a$ and $C_a$, the dielectric equivalent circuit diagram is integrated in a test circuit which has a test voltage $u_0(t)$ and a measurement resistance $R_m$ at which a step response $u_a(t)$ can be measured in the event that a step function is applied as a test voltage $u_0(t)$.

Figure 2:
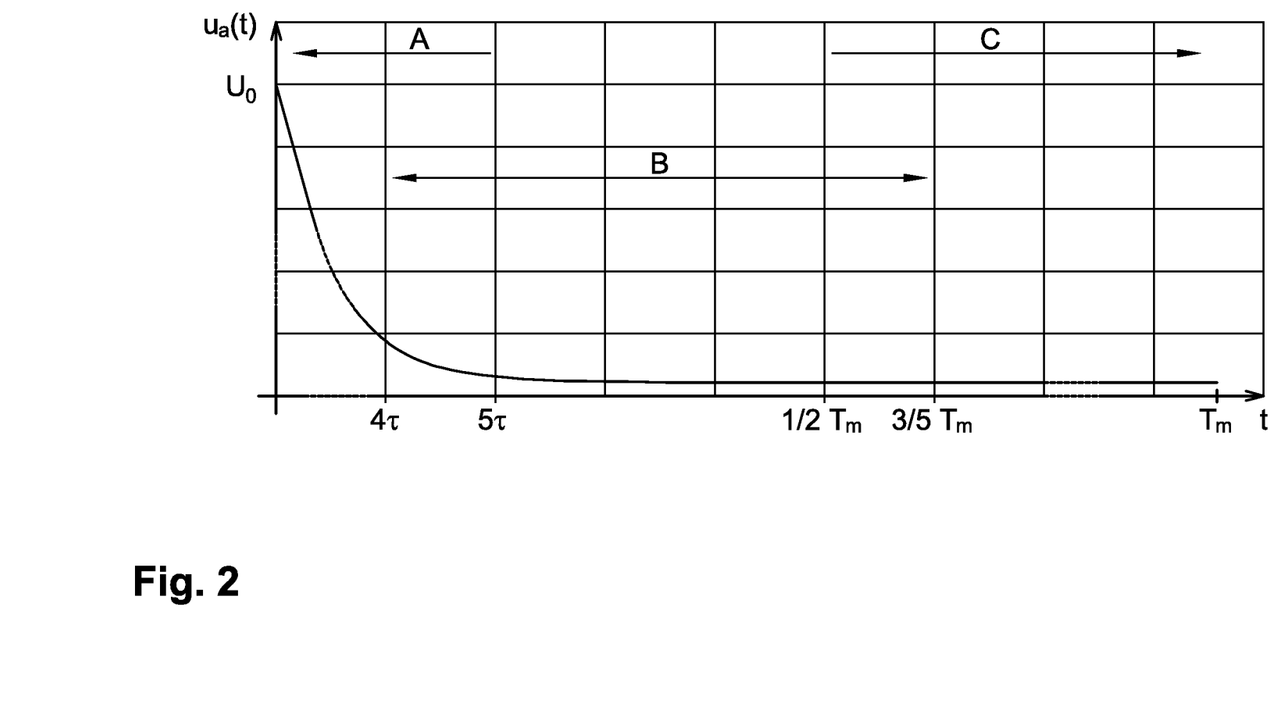
FIG. 2 shows a progression of the voltage via the measurement resistance $R_m$ (step response $u_a(t)$)

In FIG. 2, the progression of the voltage at measurement resistance $R_m$ is shown. The voltage progression coincides with step response $u_a(t)$ when applying a step function as test voltage $u_0(t)$. Step response $u_a(t)$ is recorded over a measuring period $T_m$ which can be divided into three partial sections A, B and C which in turn can also overlap.

Temporal section A extends from a point in time t=0, at which the voltage amplitude has the value of the height of step function $U_0$, to approximately the point in time $5*\tau$, $\tau$ forming the time constant of the exponential voltage progression. A second temporal section B extends from approximately from the four- to fivefold of the time constant to approximately ⅗ of measuring period $T_m$. A third temporal section C encompasses the duration from approximately one half of measuring period $T_m$ to the end of measuring period $T_m$. From this temporal section C, which represents the settled state and in which leakage capacitance $C_e$ and absorption capacitance $C_a$ can be seen as open-circuited, fault resistance $R_f$ is preferably calculated by determining an average when measurement resistance $R_m$ is known. Assuming the settling process is nearly terminated at five times time constant Ω, an initial value $C_{e0}$ is determined for leakage capacitance $C_e$ from thus identified time constant $\tau$ and with the knowledge of measurement resistance $R_m$ and previously determined fault resistance $R_f$.

After analytically calculating fault resistance $R_f$ from temporal section C and analytically determining initial value $C_{e0}$ of leakage capacitance $C_e$ from temporal section A, absorption resistance $R_a$ and absorption capacitance $C_a$ are numerically determined in middle temporal section B of step function $U_a(t)$, and leakage capacitance $C_e$ is more precisely determined via an approximation algorithm.

Figure 3:
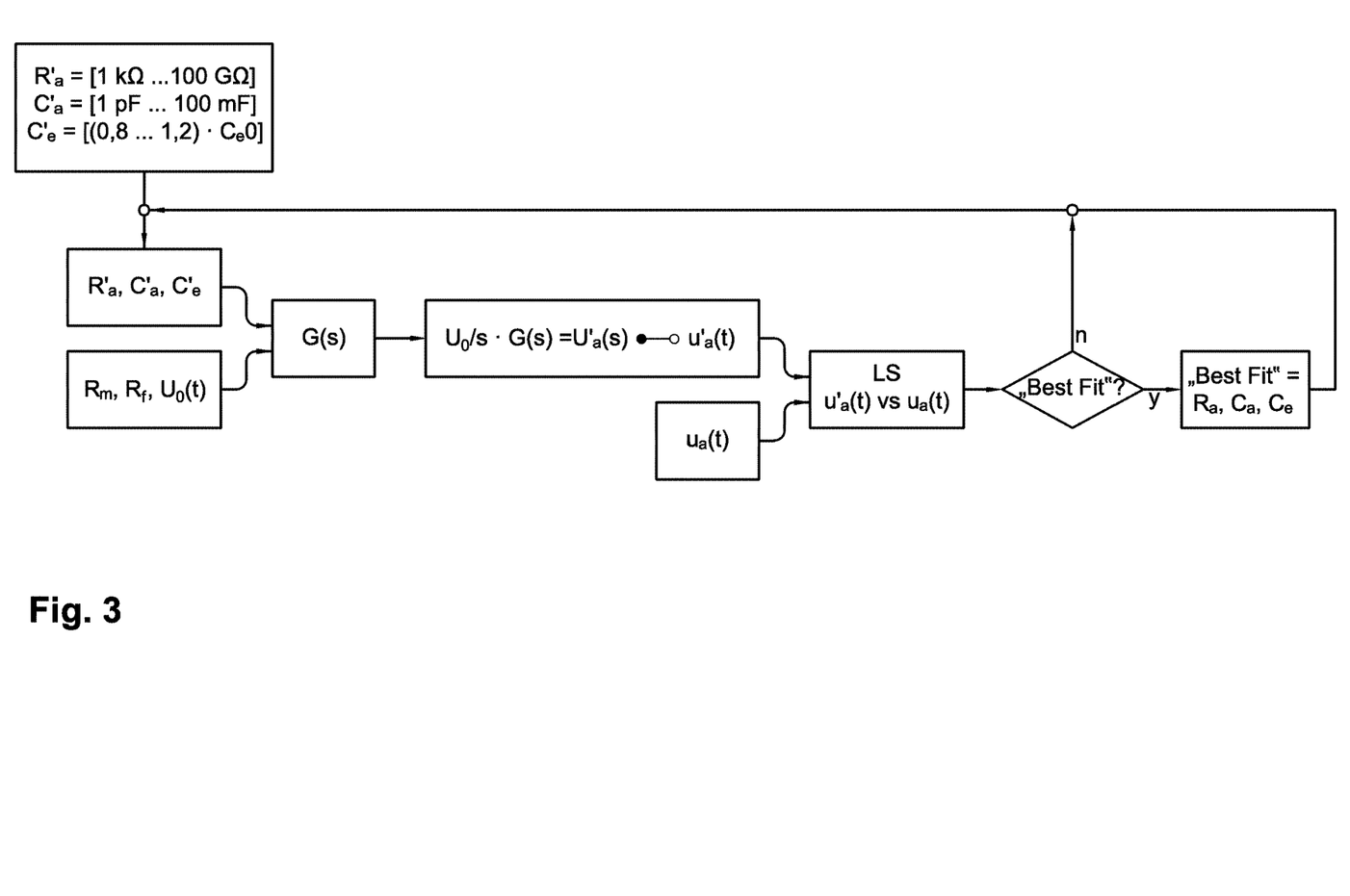
FIG. 3 shows steps of the numerical signal processing by means of approximation algorithms.

In FIG. 3, the steps for digital signal processing are shown which iteratively identify approximated values $R'_a$, $C'_a$, $C'_e$ for absorption resistance $R_a$, absorption capacitance $C_a$ and leakage capacitance $C_e$ via the approximation method in a numeric manner.

Assuming broad value fields for absorption resistance $R_a$ (1 kΩ . . . 100 GΩ), for absorption capacitance $C_a$ (1 pF . . . 100 mF) and leakage capacitance $C_e=(0.8$ . . . $1.2)*C_{e0}$, initial values are first established for these three quantities. Naturally empirical values from specific installations can be resorted to as well.

Transfer function G(s) is calculated by further incorporating the known value for measurement resistance $R_m$ and identified fault resistance $R_f$. The transfer function is multiplied by the Laplace-transformed step function $U_0(s)$ (step height $U_0$) and yields signal output $U'_a(s)$. This output signal $U'_a(s)$ leads to output signal $u'_a(t)$ which was transformed in the time domain and is compared to the real captured step response $u_a(t)$ according to the least squares method. By continuously varying approximated values $R'_a$, $C'_a$, $C'_e$ for absorption resistance $R_a$, for absorption capacitance $C_a$ and for leakage capacitance $C_e$, a new transfer function G(s) is iteratively calculated until the sum of the error squares falls below a set threshold value when comparing output signal $u'_a(t)$ transformed in the time range to recorded step response $u_a(t)$. Consequently the values of absorption value $R_a$, absorption capacitance $C_a$ and leakage capacitance $C_e$ are determined precisely enough.

Figure 4:
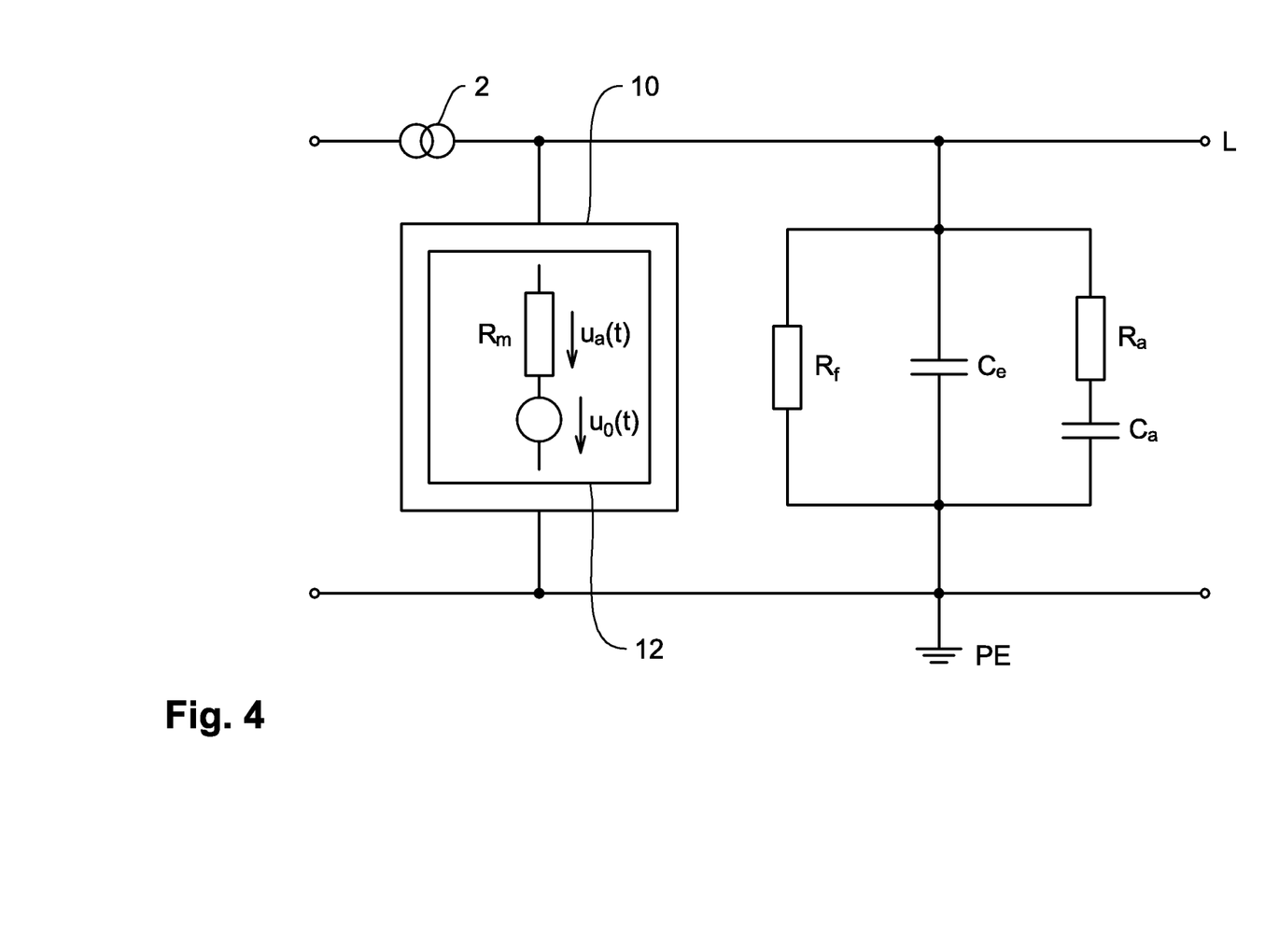
FIG. 4 shows a test device according to the invention in an ungrounded power supply system.

FIG. 4 shows a test device 10 according to the invention in an ungrounded power supply system 2. Test device 10 is connected between active conductor L of power supply system 2 and ground PE and comprises a signal processing device 12 according to the invention configured for executing the method according to the invention.

Figure 5:
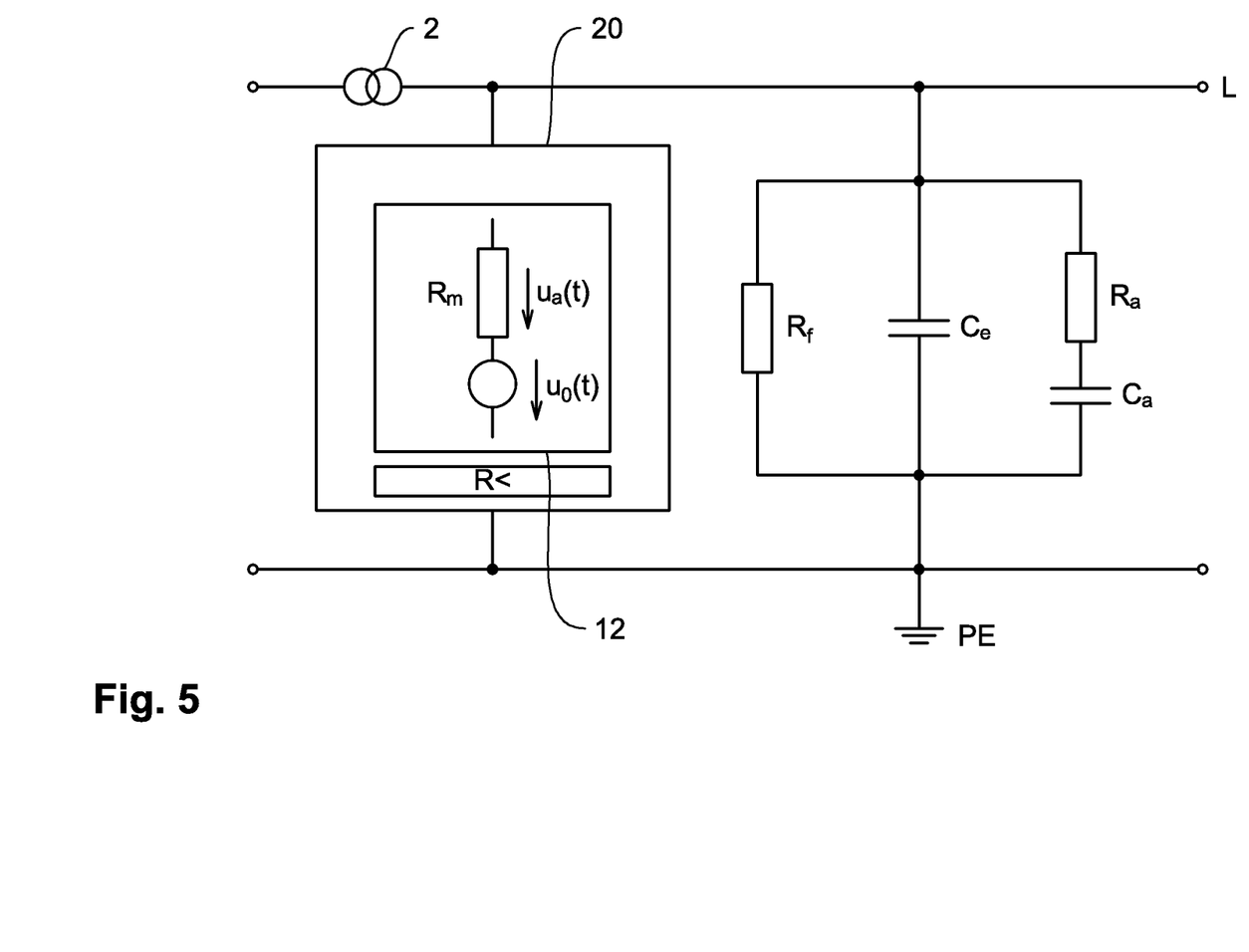
FIG. 5 shows an insulation monitoring device having a signal processing device according to the invention.

In FIG. 5, an insulation monitoring device 20 is shown in ungrounded power supply system 2. Standardized insulation monitoring device 20 is connected between active conductor L of power supply system 2 and ground PE and additionally comprises signal processing device 12 according to the invention for executing the method according to the invention for determining the elements of the dielectric equivalent circuit diagram for an insulation.

The invention claimed is:

1. A method for determining the elements of a dielectric equivalent circuit diagram for an insulation of an electric system, the equivalent circuit diagram being a parallel connection made up of a fault resistance ($R_f$), a leakage capacitance ($C_e$) and an absorption element which is made up of a series connection of an absorption resistance ($R_a$) and an absorption capacitance ($C_a$), comprising the method steps:

applying a voltage step to the electric system as a test voltage ($u_0(t)$) of a voltage source having a known measurement resistance ($R_m$) in series to the voltage source;

measuring a voltage dropping at the measurement resistance ($R_m$) as a step response ($u_a(t)$) of the electric system; wherein recording the step response ($u_a(t)$) over a measuring period ($T_m$) whose duration approximately corresponds to a twofold settling phase of the step response ($u_a(t)$);

calculating the fault resistance ($R_f$) from the progression of the step response ($u_a(t)$) in the settled state;

determining the time constant ($\tau$) from the progression of the step response ($u_a(t)$) in the settling phase;

calculating an initial value ($C_{e0}$) of the leakage capacitance ($C_e$) from the time constant ($\tau$), the fault resistance ($R_f$) and the measurement resistance ($R_m$);

forming a transfer function (G(s)) of the electric system, which was modelled by the equivalent circuit diagram using the equivalent circuit diagram elements ($R_f$, $C_e$, $R_a$, $C_a$) and the measurement resistance ($R_m$), as a ratio between an output signal ($U'_a(s)$) at the measurement resistance ($R_m$) and a test signal ($U_0(s)$) of the voltage source as an input signal;

calculating the output signal ($U'_a(s)$) from the transfer function ($G(s)$) using a step function as a test signal ($U_0(s)$) while incorporating the calculated fault resistance ($R_f$), the calculated initial value ($C_{e0}$) of the leakage capacitance ($C_e$) and the known measurement resistance ($R_m$), the absorption resistance ($R_a$), the absorption capacitance ($C_a$) and the leakage capacitance ($C_e$) each being iteratively determined in such a manner via approximate values ($R'_a$, $C'_a$, $C'_e$) by means of an approximation algorithm that the deviation between the calculated output signal ($u'_a(t)$) transformed in the time range and the measured recorded step function ($u_a(t)$) is minimized.

2. The method according to claim 1, wherein the approximation algorithm minimizes the deviation in a temporal section between the four- to fivefold time constant ($\tau$) and the metrological end of the settling phase at approximately ⅗ of the measuring period ($T_m$).

3. The method according to claim 1, wherein the approximation algorithm functions according to the least squares method.

4. The method according to claim 1, wherein an application determines the dielectric characteristics of an insulation in an ungrounded power supply system in conjunction with insulation monitoring.

5. A test apparatus for determining the elements of a dielectric equivalent circuit diagram for an insulation of an electric system, wherein a signal processing device is configured for executing the method according to the invention for determining the elements of a dielectric equivalent circuit diagram for an insulation of an electric system according to claim 1.

6. An insulation monitoring device for identifying an insulation resistance of an ungrounded power supply system, wherein a signal processing device is configured for executing the method according to the invention for determining the elements of a dielectric equivalent circuit diagram for insulating an ungrounded power supply system according to claim 1.

7. The insulation monitoring device according to claim 6, a variable measurement resistance ($R_m$) and/or a variable coupling impedance for low-noise detection for a test voltage ($u_0(t)$) having variable amplitude.

* * * * *